United States Patent
Park

(10) Patent No.: US 7,339,193 B2
(45) Date of Patent: Mar. 4, 2008

(54) DUAL PANEL-TYPE ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 319 days.

(21) Appl. No.: 11/017,777

(22) Filed: Dec. 22, 2004

(65) Prior Publication Data

US 2005/0139839 A1    Jun. 30, 2005

(30) Foreign Application Priority Data

Dec. 26, 2003 (KR) ............... 10-2003-0097880

(51) Int. Cl.
*H01L 29/04* (2006.01)
(52) U.S. Cl. ............... 257/72; 257/59; 257/40
(58) Field of Classification Search ............ 257/72, 257/40, 59
See application file for complete search history.

(56) References Cited

U.S. PATENT DOCUMENTS

| | | | |
|---|---|---|---|
| 6,124,917 A * | 9/2000 | Fujioka et al. | 349/153 |
| 6,175,345 B1 | 1/2001 | Kuribayashi et al. | |
| 6,548,961 B2 | 4/2003 | Barth et al. | |
| 6,919,680 B2 | 7/2005 | Shimoda et al. | |
| 2002/0158577 A1 | 10/2002 | Shimoda et al. | |
| 2003/0025118 A1* | 2/2003 | Yamazaki et al. | 257/79 |
| 2005/0148143 A1* | 7/2005 | Yang et al. | 438/283 |
| 2005/0161740 A1* | 7/2005 | Park et al. | 257/347 |

FOREIGN PATENT DOCUMENTS

| | | |
|---|---|---|
| JP | 2001-117509 | 4/2001 |
| JP | 2001-177509 | 4/2001 |
| KR | 10-0365519 | 6/2002 |
| KR | 2002-0047889 | 6/2002 |
| KR | 2004-0079476 | 9/2004 |
| WO | WO 02078101 | 10/2002 |
| WO | WO-02/078101 | 10/2005 |

* cited by examiner

*Primary Examiner*—Zandra V. Smith
*Assistant Examiner*—Tsz Chiu
(74) *Attorney, Agent, or Firm*—Morgan, Lewis & Bockius LLP

(57) ABSTRACT

A dual panel-type organic electroluminescent display device includes first and second substrates facing and spaced apart from each other, an array element layer disposed along an inner surface of the first substrate, the array element including a thin film transistor, a connection pattern disposed on the array element layer and electrically connected to the thin film transistor, a color filter layer disposed along an inner surface of the second substrate, the color filter layer including red, green, and blue color filters, an overcoat layer disposed on the color filter layer, the overcoat layer including a hygroscopic material, an organic electroluminescent diode disposed on the overcoat layer and connected to the connection pattern, the organic electroluminescent diode including a first electrode, an organic light-emitting layer, and a second electrode sequentially formed on the overcoat layer, and the organic light-emitting layer emits substantially monochromatic light, and a seal pattern along peripheral portions between the first and second substrates.

10 Claims, 7 Drawing Sheets

DUAL PANEL-TYPE ORGANIC ELECTROLUMINESCENT DISPLAY DEVICE AND METHOD OF FABRICATING THE SAME

The present invention claims the benefit of Korean Patent Application No. P2003-0097880 filed in Korea on Dec. 26, 2003, which is hereby incorporated by reference.

BACKGROUND OF THE INVENTION

1. Field of the Invention

The present invention relates to a display device and a method of fabricating a display device, and more particularly, to a dual panel-type OELD device and a method of fabricating a dual panel-type OELD device.

2. Discussion of the Related Art

Presently, OELD devices are self-luminescent and do not require additional light sources. In addition, OELD devices have wide viewing angles and high contrast ratios, and are relatively small and lightweight, as compared to a liquid crystal display (LCD) devices and plasma display panel (PDP) devices. Moreover, OELD devices have low power consumption, and are commonly driven by low direct current (DC) voltages, thereby providing relatively short response times. Since OELD devices are solid state, they can operate within a wide range of temperatures, and are unlikely to be damaged by external impacts. Furthermore, as compared to LCD devices or PDP devices, OELD devices have reduced manufacturing costs, wherein only deposition and encapsulation apparatuses are used for fabrication.

FIG. 1 is a cross sectional view of an OELD device according to the related art. In FIG. 1, an OELD device includes a first substrate 10 and a second substrate 60 facing the first substrate with a predetermined space therebetween. An array element layer AL is formed on an inner surface of the first substrate 10, and includes a thin film transistor T formed at each pixel region P, which is a minimum unit for an image. In addition, an organic electroluminescent diode E is formed on the array element layer AL. The organic electroluminescent diode E includes a first electrode 48, an organic light-emitting layer 54 and a second electrode 56 sequentially formed on the array element layer AL. Accordingly, light emitted from the organic light-emitting layer 54 is transmitted toward a transparent electrode of the first and second electrodes 48 and 56.

In general, OELD devices are categorized into one of two different types depending on an emission direction: top emission mode and bottom emission mode. In FIG. 1, the OELD device is a bottom emission mode type of OELD device, wherein the first electrode 48 is formed of a transparent material and the light emitted from the organic light-emitting layer 54 is transmitted through the first electrode 48.

In FIG. 1, the second substrate 60 serves as an encapsulation substrate, wherein a concavity 62 is formed at an inner surface of the second substrate 60 and a desiccant 64 is disposed within the concavity 62. The desiccant 64 removes any external moisture that may permeate into a space between the first and second substrates 10 and 60, thereby protecting the organic electroluminescent diode E. In addition, a seal pattern 70 is formed along peripheral portions of the first and second substrates 10 and 60, thereby sealing the first and second substrates 10 and 60.

FIG. 2A is a plan view of a pixel for an OELD device according to the related art, and FIG. 2B is a cross sectional view along II-II of FIG. 2B according to the related art. In FIGS. 2A and 2B, a buffer layer 12 is formed on a substrate 10, and a semiconductor layer 14 and a capacitor electrode 16 are formed on the buffer layer 10 with a space therebetween. Then, a gate insulating layer 18 and a gate electrode 20 are sequentially formed on a center portion of the semiconductor layer 14. The semiconductor layer 14 includes an active area 14a corresponding to the gate electrode 20, and source and drain areas 14b and 14c disposed at both sides of the active area 14a. In addition, a gate line 22 extending along a first direction is formed on the same layer as the gate electrode 20.

Next, a first passivation layer 24 covers the gate electrode 20 and the capacitor electrode 16. Then, a power electrode 26 is formed over the first passivation layer 24 corresponding to the capacitor electrode 16, wherein the power electrode 26 extends from a power supply line 28 that is formed to extend along a second direction crossing the first direction.

Then, a second passivation layer 30 is formed along an entire surface of the substrate 10 including the power electrode 26. The first and second passivation layers 24 and 30 include first and second contact holes 32 and 34 formed therethrough, wherein the first contact hole 32 exposes the drain area 14c of the semiconductor layer 14 and the second contact hole 34 exposes the source area 14b of the semiconductor layer 14. In addition, the second passivation layer 30 has a third contact hole 36 exposing a part of the power electrode 26.

Next, a source electrode 38 and a drain electrode 40 are formed on the second passivation layer 30, wherein the drain electrode 40 is connected to the drain area 14c of the semiconductor layer 14 through the first contact hole 32. In addition, the source electrode 38 is connected to the source area 14b of the semiconductor layer 14 through the second contact hole 34 and the power electrode 26 through the third contact hole 36.

In FIG. 2A, a data line 42 is formed on the same layer as the source and drain electrodes 38 and 40, and extending along the second direction to cross the gate line 22, thereby defining a pixel region P. Then, a third passivation layer 44 covers the drain electrode 40 and the source electrode 38, wherein the third passivation layer 44 has a drain contact hole 46 exposing a part of the drain electrode 40.

Next, a light-emitting area EA is defined on the third passivation layer 44, and a first electrode 48 is formed in the light-emitting area EA, wherein the first electrode 48 is connected to the drain electrode 40 through the drain contact hole 46. Then, an inter insulating layer 50 is formed on the first electrode 48 and the third passivation layer 44, thereby exposing the main portion of the first electrode 48 and covering edges of the first electrode 48. Subsequently, an organic light-emitting layer 54 is formed on the first electrode 48 and the inter insulating layer 50 within the light-emitting area EA, and a second electrode 56 is formed along an entire surface of the substrate 10 including the organic light-emitting layer 54.

In FIGS. 2A and 2B, the semiconductor layer 14, the gate electrode 20, the source electrode 38 and the drain electrode 40 constitute a driving thin film transistor Td, and is disposed between a switching thin film transistor Ts (in FIG. 2A) and the power supply line 28. The switching thin film transistor Ts is located at a crossing portion of the gate line 22 and the data line 42, and has the same structure as the driving thin film transistor Td.

In FIG. 2A, the gate electrode 20 of the driving thin film transistor Td is connected to the switching thin film transistor Ts, and the drain electrode 40 of the driving thin film transistor Td is formed having an island shape. Accordingly, the switching thin film transistor Ts includes another gate electrode that extends from the gate line 22 and another source electrode that extends from the data line 42. In addition, the power supply line 28 (including the power electrode 26) and the capacitor electrode 16 overlap each other to form a storage capacitor Cst.

Fabrication of the bottom emission mode OELD device includes attaching a substrate including array elements and organic luminescent diodes, and another substrate for encapsulation. Since fabrication yield of the OELD device is dependent upon fabrication yields of the array elements and the organic luminescent diodes, an entire fabrication yield is largely affected by fabrication of organic luminescent diode. Thus, even though the array elements may be properly fabricated, if the organic light-emitting layer is improperly fabricated, such forming the layer having a thickness of about 1,000 Å or incorporating impurities or other factors, the resulting OELD device will be determined to be unacceptable. Thus, all manufacturing costs and source materials required for fabrication of the array elements are wasted, and product yield is lowered.

Although the bottom emission mode OELD device has excellent stability and a certain degree of freedom in its fabrication processes, the bottom emission mode OELD device has a reduced aperture ratio. Thus, the bottom emission mode OELD device is not generally suitable for a high aperture device. Conversely, a top emission mode OELD device has a high aperture ratio, is easy to fabricate, and has a long operational lifetime. However, in the top emission mode OELD device, since a cathode is generally disposed over the organic light-emitting layer, a choice of material with which to make the cathode is limited. Accordingly, light transmittance is limited, and light-emitting efficacy is reduced. Furthermore, in order to improve the light transmittance, the passivation layer should be formed as a thin film, thereby preventing infiltration of the exterior moisture and air.

SUMMARY OF THE INVENTION

Accordingly, the present invention is directed to a dual panel-type OELD device and a method of fabricating a dual panel-type OELD device that substantially obviate one or more of the problems due to limitations and disadvantages of the related art.

An object of the present invention is to provide a dual panel-type OELD device and a method of fabricating a dual panel-type OELD device having a high aperture ratio and producing high definition images.

Another object of the present invention is to provide a dual panel-type OELD device and a method of fabricating a dual panel-type OELD device having an improved yield and productivity.

Another object of the present invention is to provide a dual panel-type OELD device and a method of fabricating a dual panel-type OELD device having improved operational reliability.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a dual panel-type organic electroluminescent display device includes first and second substrates facing and spaced apart from each other, an array element layer disposed along an inner surface of the first substrate, the array element including a thin film transistor, a connection pattern disposed on the array element layer and electrically connected to the thin film transistor, a color filter layer disposed along an inner surface of the second substrate, the color filter layer including red, green, and blue color filters, an overcoat layer disposed on the color filter layer, the overcoat layer including a hygroscopic material, an organic electroluminescent diode disposed on the overcoat layer and connected to the connection pattern, the organic electroluminescent diode including a first electrode, an organic light-emitting layer, and a second electrode sequentially formed on the overcoat layer, and the organic light-emitting layer emits substantially monochromatic light, and a seal pattern along peripheral portions between the first and second substrates.

In another aspect, a method of fabricating a dual panel-type organic electroluminescent display device includes forming an array element layer on a first substrate, the array element layer including a thin film transistor, forming a connection pattern on the array element layer, the connection pattern electrically connected to the thin film transistor, forming a color filter layer on a second substrate, forming an overcoat layer on the color filter layer, the overcoat layer including a hygroscopic material, forming an organic electroluminescent diode on the overcoat layer, the organic electroluminescent diode including a first electrode, an organic light-emitting layer and a second electrode sequentially formed, the organic light-emitting layer emits substantially monochromatic light, and attaching the first and second substrates together, wherein the second electrode is connected to the connection pattern.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
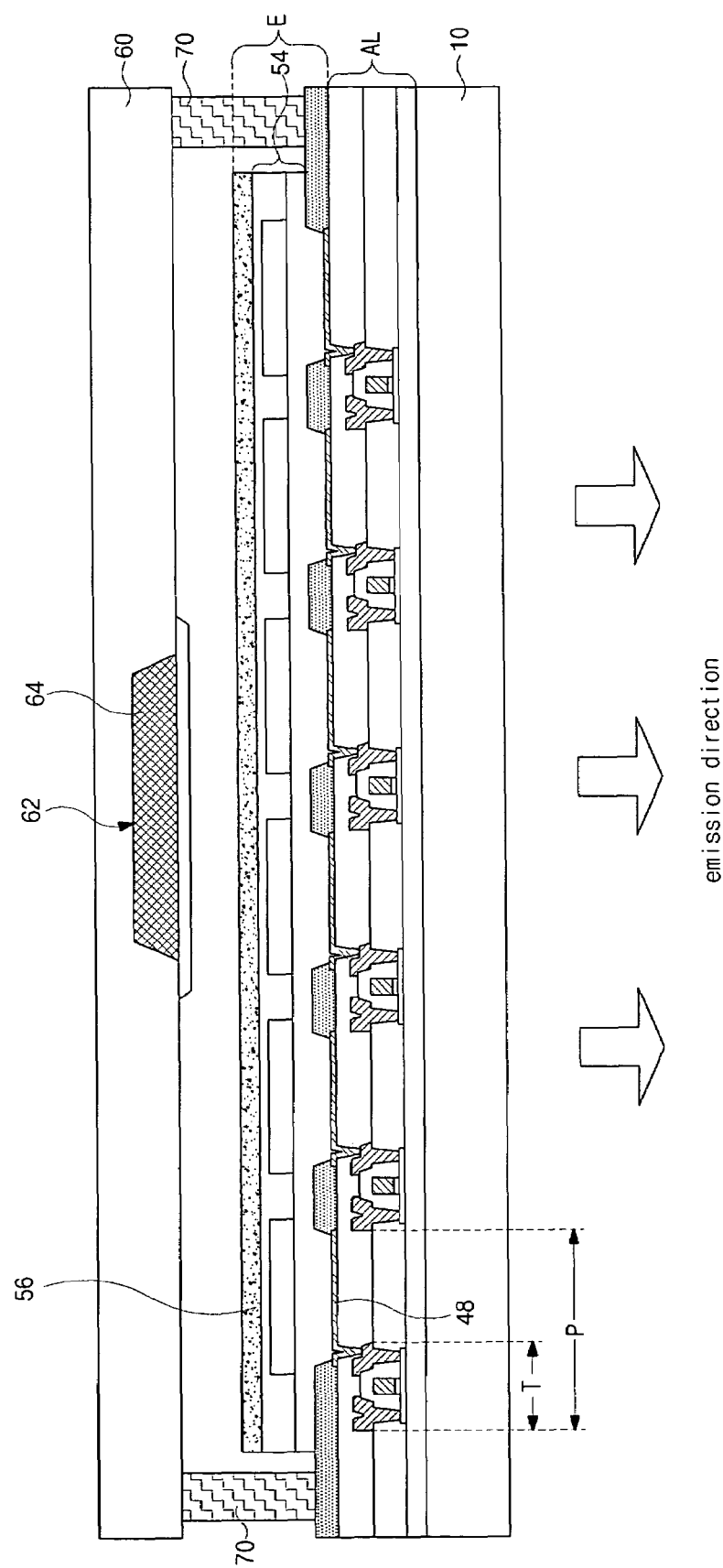
FIG. 1 is a cross sectional view of an OELD device according to the related art.
Figure 2A:
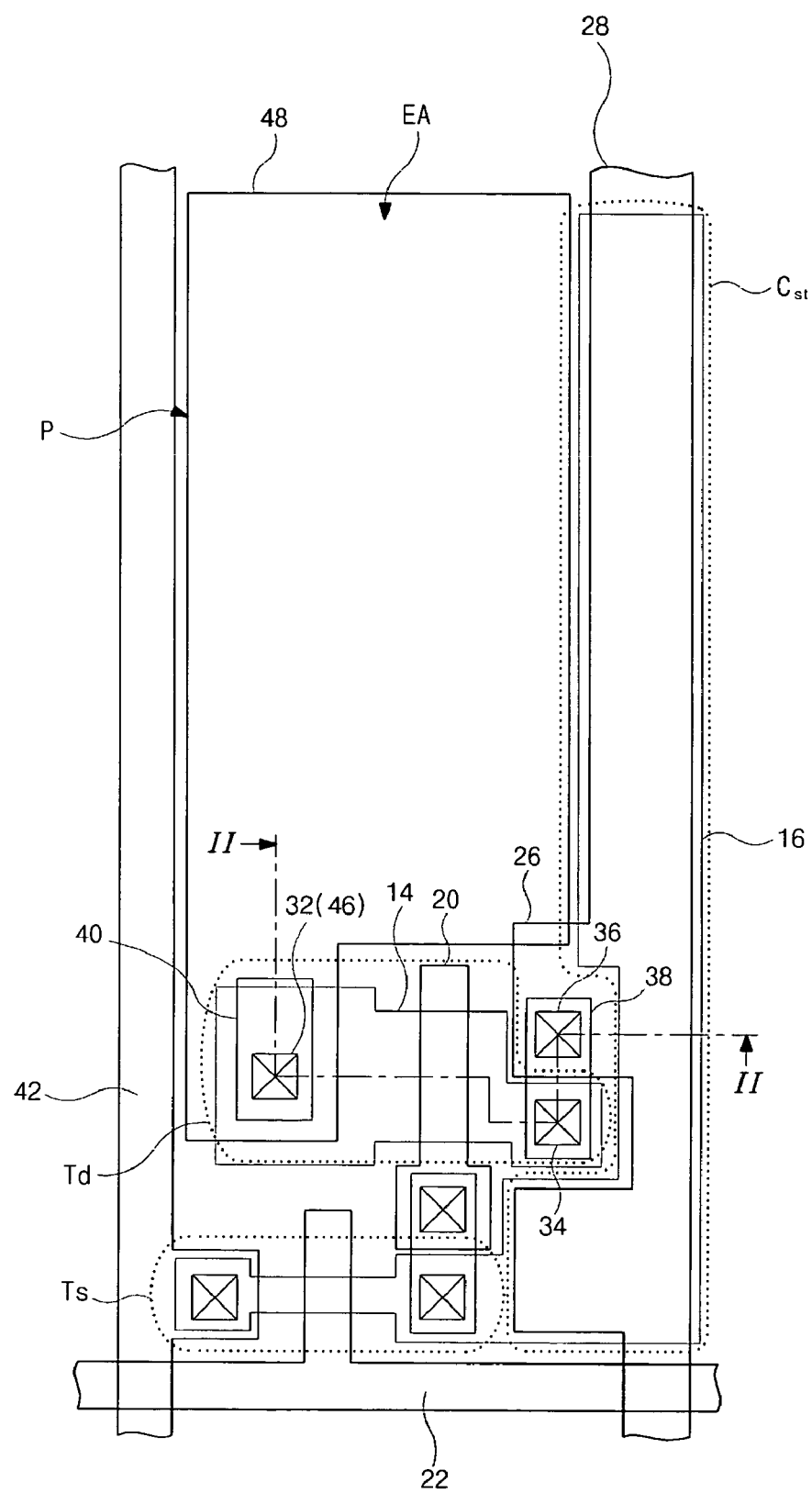
FIG. 2A is a plan view of a pixel for an OELD device according to the related art.
Figure 2B:
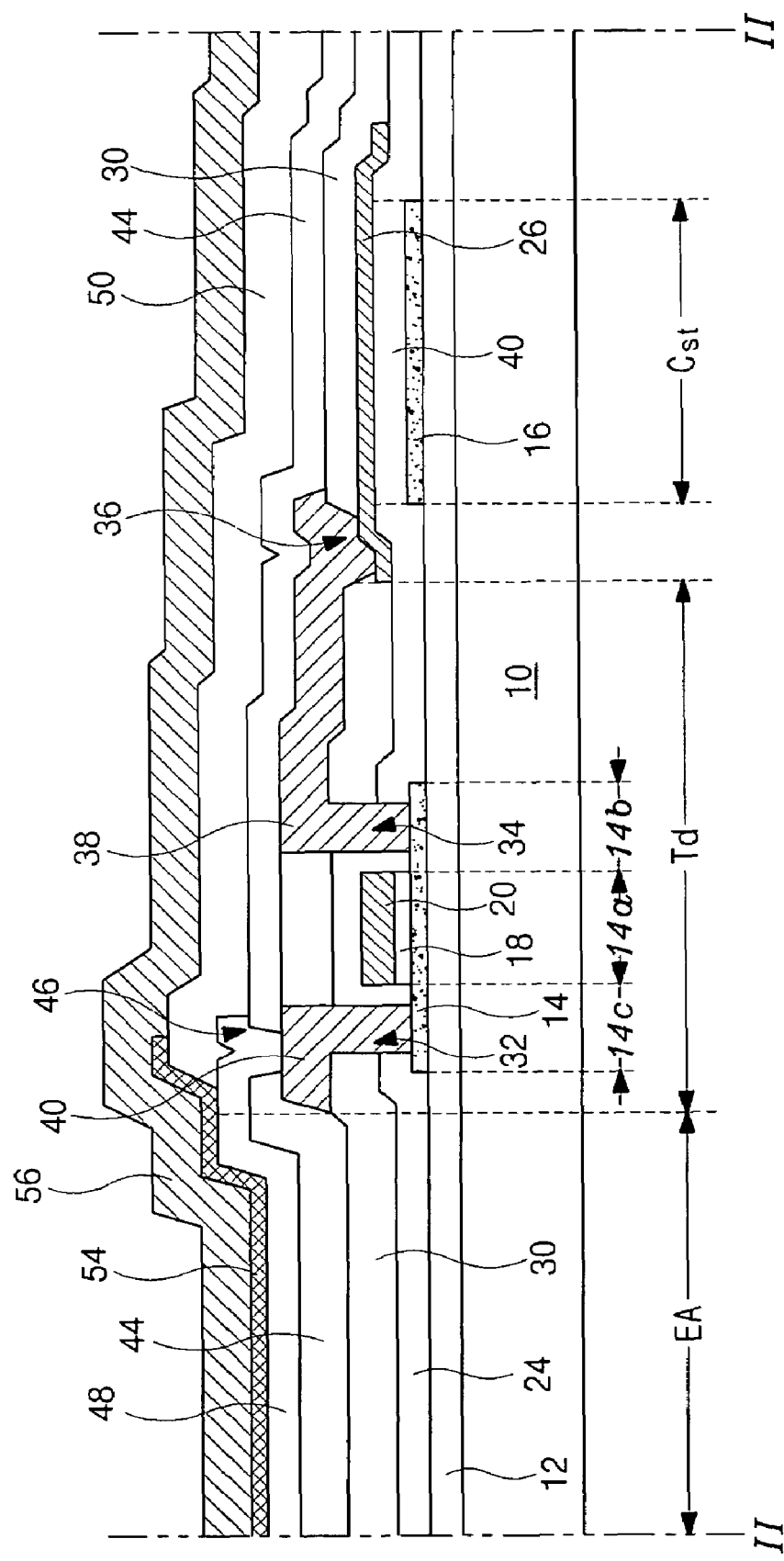
FIG. 2B is a cross sectional view along II-II of FIG. 2B according to the related art.
Figure 3:
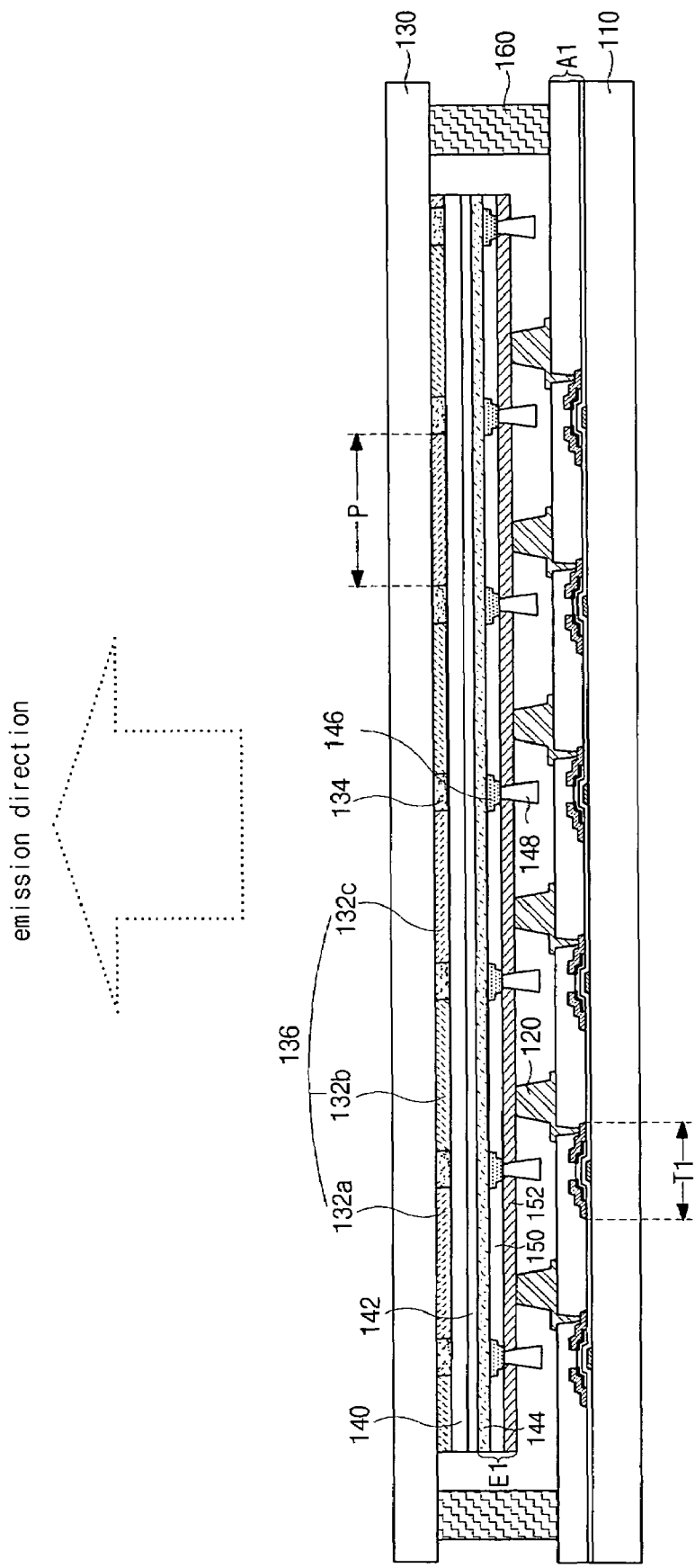
FIG. 3 is a cross sectional view of an exemplary dual panel-type OELD device according to the present invention.

FIG. 3 is a cross sectional view of an exemplary dual panel-type OELD device according to the present invention. In FIG. 3, a dual panel-type OELD device may include a first substrate 110 and a second substrate 130 that are spaced apart and face each other. In addition, an array element layer A1 including a plurality of thin film transistors T1 may be formed on an inner surface of the first substrate 110, wherein a plurality of connection patterns 120 having a predetermined thickness may be formed on the array element layer A1. Accordingly, each connection pattern 120 may be connected to each thin film transistor T1. Although not shown, the array element layer A1 may further includes gate lines, data lines, power lines, and switching thin film transistors.

The connection patterns 120 may be formed of an organic insulating material that enables the connection patterns 120 to have a relatively large thickness, and the connection patterns 120 may be multi-layered structures. A range of thicknesses of the connection patterns 120 may be selected from a thickness range such that a pixel driving part and an emission part formed on different substrates may be electrically connected to each other by the connection patterns 120. Thus, the thickness of the connection patterns 120 may correspond to a cell gap between the substrates 110 and 130.

The thin film transistors T1 of FIG. 3, which are connected to the connection patterns 120, respectively, may function as driving thin film transistors for providing an organic electroluminescent diode with electrical currents and for controlling brightness of emitted light. In addition, the thin film transistors T1 may have an inverted staggered structure using amorphous silicon as the active layer.

In FIG. 3, a color filter layer 136 and a black matrix 134 may be formed on an inner surface of the second substrate 130. The color filter layer 136 may include red, green, and blue color filters 132a, 132b, and 132c, and the black matrix 134 may be disposed between adjacent color filters 132a, 132b, and 132c of the color filter layer 136. In addition, an overcoat layer 140 and a barrier layer 142 may be sequentially formed on the color filter layer 136 and the black matrix 134. The overcoat layer 140 may function to planarize a surface of the second substrate 130 including the color filter layer 136 and the black matrix 134, and the barrier layer 142 may prevent outgassing from the color filter layer 136.

In FIG. 3, a first electrode 144 may be formed on the barrier layer 142, and an insulating pattern 146 and a partition wall 148 may be sequentially formed on the first electrode 144 within a non-pixel area. In addition, the partition wall 148 may have inverted tapered sidewalls. Then, an organic light-emitting layer 150 and a second electrode 152 may be sequentially formed on the first electrode 144 within a pixel region P. The organic light-emitting layer 150 and the second electrode 152 may be disposed between adjacent partition walls 148 and between adjacent insulating patterns 146. Accordingly, the organic light-emitting layer 150 and the second electrode 152 may be automatically patterned due to the partition wall 148, and may not require additional patterning processes.

In FIG. 3, the first electrode 144, the second electrode 152, and the organic light-emitting layer 150 may constitute an organic electroluminescent diode E1. Accordingly, the second electrode 152 may be connected to the connection pattern 120, and currents provided by the thin film transistor T1 may be supplied to the second electrode 152 through the connection pattern 120. For the OELD device to function in a top emission mode, where light emitted from the organic light-emitting layer 150 is transmitted through the first electrode 144, the first electrode 144 may be formed of a light transmitting material. For example, as the first electrode 144 may function as an anode and the second electrode 152 may function as a cathode, the first electrode 144 may be formed of a transparent conductive material, such as indium tin oxide (ITO). In addition, a seal pattern 160 may be formed along peripheral portions of the first and second substrates 110 and 130 to seal the first and second substrates 110 and 130.

In FIG. 3, the color filter layer 136 may function as a full color element. Although not shown, the full color element may further include color-changing mediums (CCM) disposed between the color filter layer 136 and the overcoat layer 140. By using the full color element, the organic light-emitting layer may emit only substantially monochromatic light. In addition, when a single structure of a color filter layer is used as a full color element, the organic light-emitting layer may emit white light. Similarly, when a double structure of a color filter layer and color-changing mediums (CCM) is used as a full color element, the organic light-emitting layer may emit sky blue light or greenish blue light. However, an OELD device including such a full color element may produce dark spots within the pixel regions due to outgassing from the full color element, i.e., the color filter layer or the color filter layer/CCM.

The color filter layer or the color filter layer/CCM may be formed by mixing a solution including a material for the color filter layer or the color filter layer/CCM with a solvent. Then, the solution may be coated by one of a spin coating method, a slit coating method, and an extrusion coating method. Next, the as-coated solution may be baked to form a layer. However, since it is not easy to completely remove the solvent, some of the solvent may remain within the layer. Accordingly, complete removal of the solvent may result in reducing productivity. Thus, the barrier layer may be used to prevent the solvent or moisture in the layer from permeating the organic electroluminescent diode. However, since the barrier layer may have pin holes or foreign bodies therein, the solvent or moisture may still be able to permeate into the organic electroluminescent diode through the barrier layer.

Outgassing from the full color element due to the solvent or moisture adversely affects the organic electroluminescent diode and causes formation of the dark spots within the pixel regions. Moreover, a size of the dark spots increases as an applied voltage increases to the first and second electrodes of the organic electroluminescent diode, thereby lowering reliability and lifespan of the OELD device.

According to the present invention, an overcoat layer, which may be formed of a hygroscopic material, may be used so as to substantially completely prevent moisture from permeating the organic electroluminescent diode, and thus prevent formation of dark spots.

Figure 4:
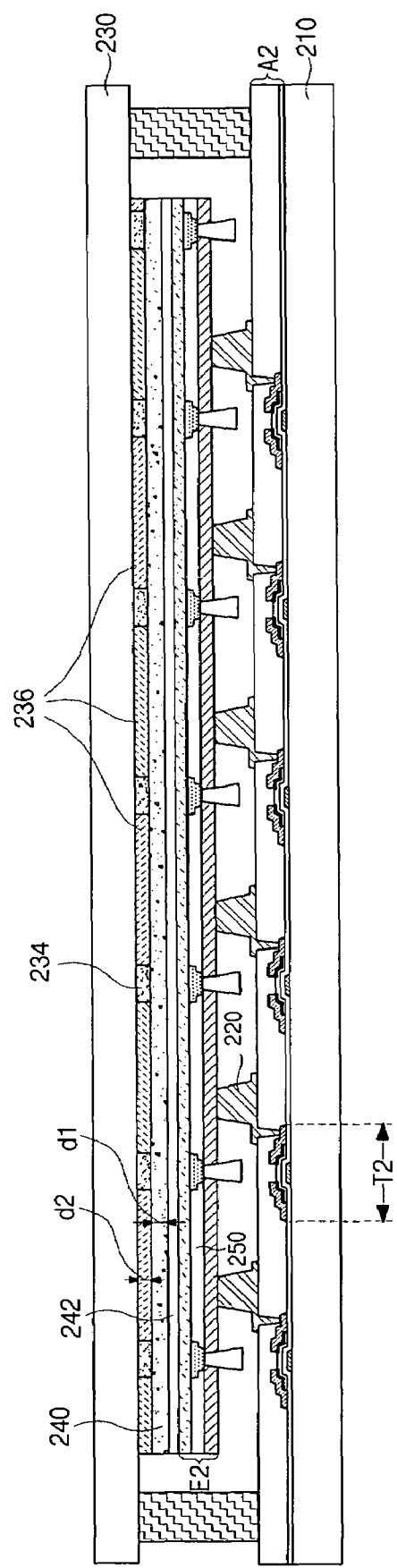
FIG. 4 is a cross sectional view of another exemplary dual panel-type OELD device according to the present invention.

FIG. 4 is a cross sectional view of another exemplary dual panel-type OELD device according to the present invention. In FIG. 4, an array element layer A2 including a plurality of thin film transistors T2 may be formed on an inner surface of a first substrate 210. In addition, a plurality of connection patterns 220 may be formed on the array element layer A2, and may be connected to the plurality of thin film transistors T2.

Then, a color filter layer 236, as a full color element, and a black matrix 234 may be formed on an inner surface of a second substrate 230. Next, an overcoat layer 240, such as a hygroscopic material, may be formed on the color filter layer 236, a barrier layer 242 may be formed on the overcoat layer 240, and an organic electroluminescent diode E2, which may have a similar structure as that of the organic electroluminescent diode E1 (in FIG. 3), may formed on the barrier layer 242.

The overcoat layer 240 may be formed of a hygroscopic material so that the overcoat layer 240 prevents moisture remaining after baking of the color filter layer 236 from permeating into the organic electroluminescent diode E2. Thus, formation of dark spots that may be caused by the permeated moisture may be prevented. The hygroscopic material for the overcoat layer 240 may be also transparent so that light emitted by the organic electroluminescent diode E2 may be transmitted through the color filter layer 236. In addition, since the overcoat layer 240 may planarize a surface of the second substrate 230 including the color filter layer 236, a thickness d1 of the overcoat layer 240 may be equal to or greater than a thickness d2 of the color filter layer 236. For example, when the thickness d2 of the color filter layer 236 may be about 1 µm, the thickness d1 of the overcoat layer 240 may be within a range of about 1 µm to about 3 µm. Thus, an organic light-emitting layer 250 of the organic electroluminescent diode E2 may emit substantially monochromatic light, such as white light.

In FIG. 4, since the overcoat layer 240 may be formed of a hygroscopic material to remove moisture or solvent produced by the color filter layer 236 from permeating into the organic electroluminescent diode E2, deterioration of image quality may be prevented due to preventing the production of dark spots. The overcoat layer 240 may function as a moisture absorption layer, and thus no additional space may be required for installing a moisture absorption element. In addition, according to the present invention, the barrier layer 242 may be omitted in order to reduce fabrication costs, whereby the overcoat layer 240 may function as a barrier layer.

Figure 5:
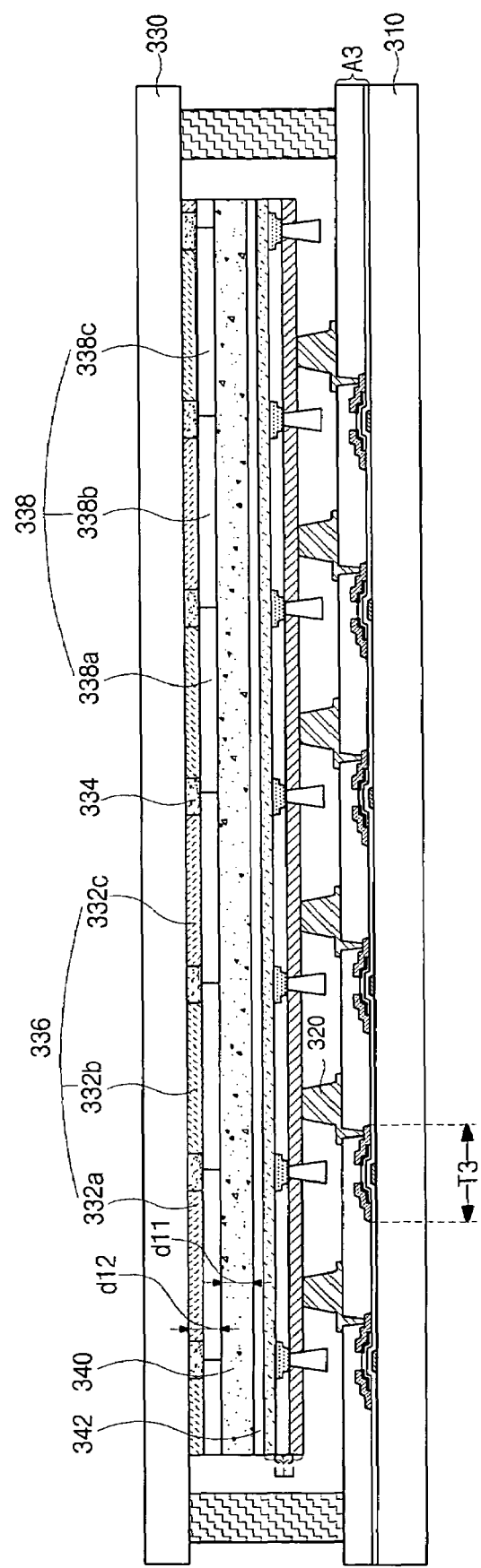
FIG. 5 is a cross sectional view of another exemplary dual panel-type OELD device according to the present invention.

FIG. 5 is a cross sectional view of another exemplary dual panel-type OELD device according to the present invention. According to the present invention, the OELD device may include a color filter layer/CCM to function as a full color element and a hygroscopic overcoat layer. In FIG. 5, an array element layer A3 including a plurality of thin film transistors T3 may be formed on an inner surface of a first substrate 310. In addition, a plurality of connection patterns 320 may be formed on the array element layer A3 to be connected to the plurality of thin film transistors T3.

A color filter layer 336 and a black matrix 334 may be formed on an inner surface of a second substrate 330, and CCM 338 may be formed on the color filter layer 336. Then, an overcoat layer 340, such as a hygroscopic material, may be formed on the CCM 338. Next, a barrier layer 342 may be formed on the overcoat layer 340, and an organic electroluminescent diode E3, which may have a similar structure as that of the organic electroluminescent diodes E1 (in FIG. 3) and E2(in FIG. 4), may be formed on the barrier layer 342.

The CCM 338 may include red, green, and blue CCM material layers 338a, 338b, and 338c that may correspond to red, green, and blue color filters 336a, 336b, and 336c of the color filter layer 336, respectively. If an organic light-emitting layer of the organic electroluminescent diode E3 emits bluish light, such as sky blue light or greenish blue light, then the blue CCM 338c may not transmit additional colored light. Accordingly, borders between the red, green, and blue CCM material layers 338a, 338b, and 338c may correspond to a black matrix 334.

In FIG. 5, the overcoat layer 340 may be formed of a transparent hygroscopic material. Thus, since the overcoat layer 340 may planarize a surface of the second substrate 330 including the color filter layer 336, a thickness d11 of the overcoat layer 340 may be equal to or greater than the sum d12 of thicknesses of the color filter layer 336 and the CCM 338. For example, when the sum d12 of the thicknesses of the color filter layer 336 and the CCM 338 may be about 15 µm, the thickness d11 of the overcoat layer 340 may be within a range of about 15 µm to about 20 µm.

In FIG. 5, since the overcoat layer 340 may have a thickness corresponding to the color filter layer 336 and the CCM 338, and may be formed of a hygroscopic material, then moisture or solvent from the color filter layer 336 may be prevented from permeating into the organic electroluminescent diode E3. Thus, image quality may be improved by preventing formation of dark spots within the pixel regions. In addition, the overcoat layer 340 may function as a moisture absorption layer, whereby no additional space may be required for installing a moisture absorption element. According to the present invention, in order to reduce fabrication processes, the barrier layer may be omitted, whereby the overcoat layer may function as a barrier layer.

Figure 6:
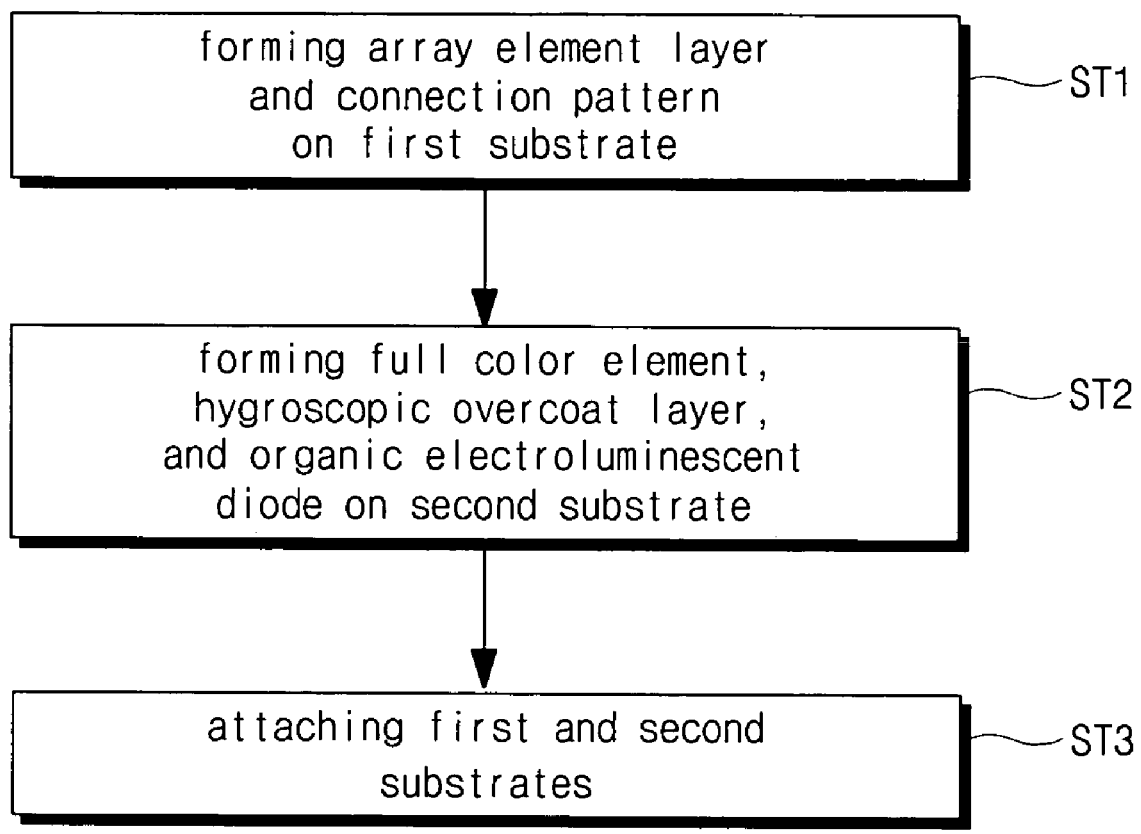
FIG. 6 is a flow chart demonstrating an exemplary method of manufacturing a dual panel-type OELD device according to the present invention.

FIG. 6 is a flow chart demonstrating an exemplary method of manufacturing a dual panel-type OELD device according to the present invention. In FIG. 6, at step ST1, an array element layer including a plurality of thin film transistors may be formed on a first substrate, and a plurality of connection patterns may be formed on the array element layer. Accordingly, each connection pattern may be connected to a respective thin film transistor. In addition, the array element layer may include a plurality of gate lines, data lines, and power lines. Each of the thin film transistors may include a switching thin film transistor that may be formed at a crossing portion of the gate and data lines, and a driving thin film transistor that may be connected to a drain electrode of the switching thin film transistor and the power line. Accordingly, the driving thin film transistor may provide the organic electroluminescent diode with electrical current.

The plurality of connection patterns may at least be formed, in part, of a conductive material, and may include a projected pattern of an organic material and a connecting electrode covering the projected pattern to be connected to the thin film transistor. Alternatively, the connection pattern may be connected to the thin film transistor through another electrode.

At step ST2, a full color element, which may include a single structure of a color filter layer or a double structure of color filter layer/CCM, may be formed along an entire surface of a second substrate. Then, an overcoat layer may be formed on the full color element, and an organic electroluminescent diode may be formed on the overcoat layer. The overcoat layer may be formed of a transparent hygroscopic material, and may have a thickness equal to or greater than a thickness of the full color element so as to planarize a surface of the second substrate including the full color element. In addition, a barrier layer may be further formed between the overcoat layer and the organic electroluminescent diode to prevent outgassing of the full color element from permeating into the organic electroluminescent diode. According to the present invention, omission of the barrier layer may be dependent upon the overcoat layer. Thus, no additional space may be required for installing a moisture absorption element since the overcoat layer may function as a moisture absorption layer.

Formation of the organic electroluminescent diode may include forming a first electrode along a substantially portion of the entire surface of the second substrate, subsequent formation of an insulating pattern and a partition wall on the first electrode within a non-pixel area, and formation of an organic light-emitting layer and a second electrode on the first electrode between adjacent to the partition walls. The partition walls may have predetermined thicknesses, and may be oriented having an inversed tapered sidewalls. Thus, the organic light-emitting layer and the second electrode may be automatically patterned due to the partition walls.

For example, since the first electrode, which may be transparent, may function as an anode, and the second electrode may function as a cathode, then the OELD device may operation in a top emission mode, where light may be transmitted through the first electrode. Accordingly, the first electrode may be formed of a transparent conductive material, such as indium tin oxide (ITO).

According to the present invention, the organic light-emitting layer may emit monochromatic light, wherein a color of light emitted by the organic light-emitting layer may be dependent upon a full color element. If the full color element has a single structure of a color filter layer, then the organic light-emitting layer may emit white light. If the full color element has a double structure of color filter/CCM, then the organic light-emitting layer may emit blue light.

At step ST3, the first and second substrates are disposed to face each other, and are attached together such that the connection pattern is connected to the second electrode of the organic electroluminescent diode. However, before attaching the substrates, a seal pattern may be formed along peripheral regions of one of the first and second substrates. Accordingly, the peripheral portions of the first and second substrates may be sealed by the seal pattern during the attaching step.

According to the present invention, since an array element and an organic electroluminescent diode of an OELD device may be formed on different substrates, yield and productivity may be improved and operational life span of the OELD device may be increased. In addition, a dual panel-type OELD device having a high aperture ratio and producing high definition images may be operated in a top emission mode. Furthermore, since an organic light-emitting layer and a second electrode may be automatically patterned due to partition walls without using a shadow mask, fabrication efficiency may be improved. Moreover, since an overcoat layer may be formed of a hygroscopic material, degradation of the OELD device due to moisture may be prevented, and efficient usage of space may be achieved.

It will be apparent to those skilled in the art that various modifications and variations can be made in the dual panel-type OELD device and the method of fabricating a dual panel-type OELD device of the present invention without departing from the spirit or scope of the invention. Thus, it is intended that the present invention covers the modifications and variations of this invention provided they come within the scope of the appended claims and their equivalents.

What is claimed is:

1. A dual panel-type organic electroluminescent display device, comprising:
   first and second substrates facing and spaced apart from each other;
   an array element layer formed along an inner surface of the first substrate, the array element including a switching thin film transistor and a driving thin film transistor;
   a connection pattern formed on the array element layer and electrically connected to the thin film transistor;
   a color filter layer formed along an inner surface of the second substrate, the color filter layer including red, green, and blue color filters;
   an overcoat layer formed on entire of the color filter layer, the overcoat layer including a hygroscopic material;
   an organic electroluminescent diode formed on the overcoat layer and connected to the connection pattern, the organic electroluminescent diode including a first electrode, an organic light-emitting layer, and a second electrode sequentially formed on the overcoat layer, and the organic light-emitting layer emits substantially monochromatic light, the second electrode connected to the driving thin film transistor;
   an insulating pattern and a partition wall for the first electrode within a non-pixel area, and an insulating pattern and a partition wall formed between adjacent organic light-emitting layers and between adjacent second electrodes; and
   a seal pattern along peripheral portions between the first and second substrates.

2. The device according to claim 1, further comprising a black matrix between adjacent ones of the red, green, and blue color filters of the color filter layer.

3. The device according to claim 1, wherein the first electrode functions as an anode and the second electrode functions as a cathode, and the first electrode is transparent to transmit light emitted from the organic light-emitting layer.

4. The device according to claim 3, wherein the hygroscopic material is transparent.

5. The device according to claim 1, wherein the overcoat layer has a thickness equal to or greater than a thickness of the color filter layer.

6. The device according to claim 1, further comprising a barrier layer between the overcoat layer and the organic electroluminescent diode.

7. The device according to claim 1, wherein the organic light-emitting layer emits white light.

8. The device according to claim 1, further comprising color-changing mediums between the first electrode and the color filter layer.

9. The device according to claim 8, wherein the overcoat layer has a thickness equal to or greater than a sum of thicknesses of the color filter layer and the color-changing mediums.

10. The device according to claim 8, wherein the organic light-emitting layer emits blue light.

* * * * *